(12) United States Patent
Wollert

(10) Patent No.: US 6,577,116 B2
(45) Date of Patent: Jun. 10, 2003

(54) CIRCUIT TEST LIGHT

(75) Inventor: Gary S. Wollert, Kenosha, WI (US)

(73) Assignee: Snap-on Technologies, Inc., Lincolnshire, IL (US)

(*) Notice: Subject to any disclaimer, the term of this patent is extended or adjusted under 35 U.S.C. 154(b) by 0 days.

(21) Appl. No.: 09/903,194

(22) Filed: Jul. 11, 2001

(65) Prior Publication Data

US 2002/0011833 A1 Jan. 31, 2002

Related U.S. Application Data

(60) Provisional application No. 60/223,835, filed on Aug. 8, 2000, and provisional application No. 60/217,727, filed on Jul. 12, 2000.

(51) Int. Cl.[7] ............................................. G01R 31/02
(52) U.S. Cl. ................... 324/133; 324/72.5; 362/367; 362/276
(58) Field of Search ............................. 324/133, 503, 324/504, 506, 508; 362/367, 351, 360, 276

(56) References Cited

U.S. PATENT DOCUMENTS

| 2,509,653 | A |   | 5/1950  | Show           |         |
|-----------|---|---|---------|----------------|---------|
| 2,581,116 | A |   | 1/1952  | Lewis          |         |
| 2,639,318 | A |   | 5/1953  | Roches         |         |
| 2,806,203 | A |   | 9/1957  | Church         |         |
| 3,193,765 | A |   | 7/1965  | Bevins         |         |
| 3,287,642 | A |   | 11/1966 | Simkins        |         |
| 3,392,334 | A |   | 7/1968  | Bevins         |         |
| 3,619,773 | A |   | 11/1971 | Lathrop        |         |
| 3,757,218 | A |   | 9/1973  | Oliverio et al.|         |
| 3,775,677 | A |   | 11/1973 | Garrett et al. |         |
| 4,021,732 | A |   | 5/1977  | Metcalf        |         |
| 4,150,798 | A |   | 4/1979  | Aragon         |         |
| 4,361,800 | A | * | 11/1982 | Fodali et al.  | 324/556 |
| 4,433,296 | A |   | 2/1984  | Kolibas        |         |
| 4,540,940 | A | * | 9/1985  | Nolan          | 324/133 |
| 4,547,722 | A |   | 10/1985 | Sarlo          | 324/504 |
| 5,581,175 | A |   | 12/1996 | Yoneyama et al.|         |
| 5,789,911 | A |   | 8/1998  | Brass          |         |
| 5,920,191 | A | * | 7/1999  | Maniero et al. | 219/486 |
| 6,433,274 | B1| * | 8/2002  | Doss et al.    | 174/50  |

FOREIGN PATENT DOCUMENTS

WO   WO 92/16850   1/1992

\* cited by examiner

*Primary Examiner*—N. Le
*Assistant Examiner*—Vincent Q. Nguyen
(74) *Attorney, Agent, or Firm*—Seyfarth Shaw

(57) ABSTRACT

A circuit test light includes a reel-shaped housing formed of a light-transmitting material, with a light source disposed in the hub of the reel and connected to the proximal ends of two elongated test leads, the distal ends of which are respectively connected to connector assemblies. At least one of the connector assemblies includes a base connector and a plurality of adapter connectors selectively connectable to the base connector for use with different types of test terminals. The leads can be wound around the hub of the reel for storage when not in use, being retained in place by a suitable strap.

11 Claims, 2 Drawing Sheets

CIRCUIT TEST LIGHT

RELATED APPLICATION

This application claims the benefit of the filing date of copending U.S. Provisional Application Nos. 60/223,835, filed Aug. 8, 2000 and 60/217,727, filed Jul. 12, 2000.

BACKGROUND

The subject matter of this application relates to a tester for determining if there is a voltage or current within a circuit. More particularly this application relates to a test light for testing automotive circuits.

There are circuit testers in the prior art which include a light to indicate the presence of voltage or current in a circuit. These prior-art testers may include a light bulb encased within a portion of a nonconductive handle and covered with a light-transmitting cover. A steel probe connected to the handle is conductively connected to one terminal of the light bulb, and a ground lead extending from the handle is conductively connected to the other terminal of the light bulb. To use these devices, the steel probe is placed in contact with a test terminal or other point in a circuit to be tested and the ground lead is conductively coupled to a ground. If there is voltage at the contact site, a current will flow between the steel probe and the lead causing the light bulb to illuminate. Even though the prior art devices may generally work for their intended purposes, for certain applications these prior art devices are inconvenient and may even cause damage.

One such application is the testing of terminals within a wire harness connector of an automotive vehicle. Wire harness connectors will typically include a number of terminals therein which may need to be tested in order to determine if there is voltage or current in a particular circuit. The configuration of the terminals in a wire harness will often vary with each different wire harness.

To properly test each terminal, it is best that the testing device be configured to appropriately mate with the terminal so that there is sufficient contact and continuity between the terminal and the testing device. The probes on the prior-art devices are not typically designed to mate well with the terminals in the wire harness. Often, the prior-art devices require a technician to forcibly mate a non-complementary probe into the terminal, possibly damaging the terminal.

The lights on the prior art devices are typically located on the probe handle. When the prior art device is used in a remote or obscure location, the light bulb in the handle is often not clearly visible to the user.

Storing and handling the prior art devices can also be cumbersome. The leads extending from the handles of the current testers are relatively long and may get in the way during use.

SUMMARY

Generally, this application relates to a test light which avoids the disadvantages of prior testers while affording additional structural and operating advantages.

An important aspect is the provision of a test light with elongated testing leads, at least one of which has interchangeable tips enabling the testing lead to conductively mate with a variety of different testing sites.

Another aspect is the provision of a test light with a bulb located well away from the test probe.

Another important aspect is the provision of a test light with a means for storing the test leads in the test light housing.

Another important aspect is the provision of a test light housing made of light-transmitting material to allow for greater visibility of the light.

Certain ones of these and other aspects may be attained by providing a circuit test light comprising: a light source, a light-transmitting housing encompassing the light source and extending substantially therebeyond, two test leads extending from the housing and each having a proximal end connected to the light source and a distal end, and connector assemblies respectively coupled to the distal ends of the test leads, whereby the light source is energizable by a voltage across the connector assemblies to illuminate the housing so that it is visible from multiple directions at locations remote from the connector assemblies.

The test light consists of certain novel features and a combination of parts hereinafter fully described and illustrated in the accompanying drawings, it being understood that various changes in the details may be made without departing from the spirit, or sacrificing any of the advantages of the subject matter sought to be protected.

BRIEF DESCRIPTION OF THE DRAWINGS

For the purpose of facilitating an understanding of the subject matter sought to be protected, there is illustrated in the accompanying drawings an embodiment thereof, from an inspection of which, when considered in connection with the following description, the subject matter sought to be protected, its construction and operation, and many of its advantages should be readily understood and appreciated.

DETAILED DESCRIPTION

Figure 1:
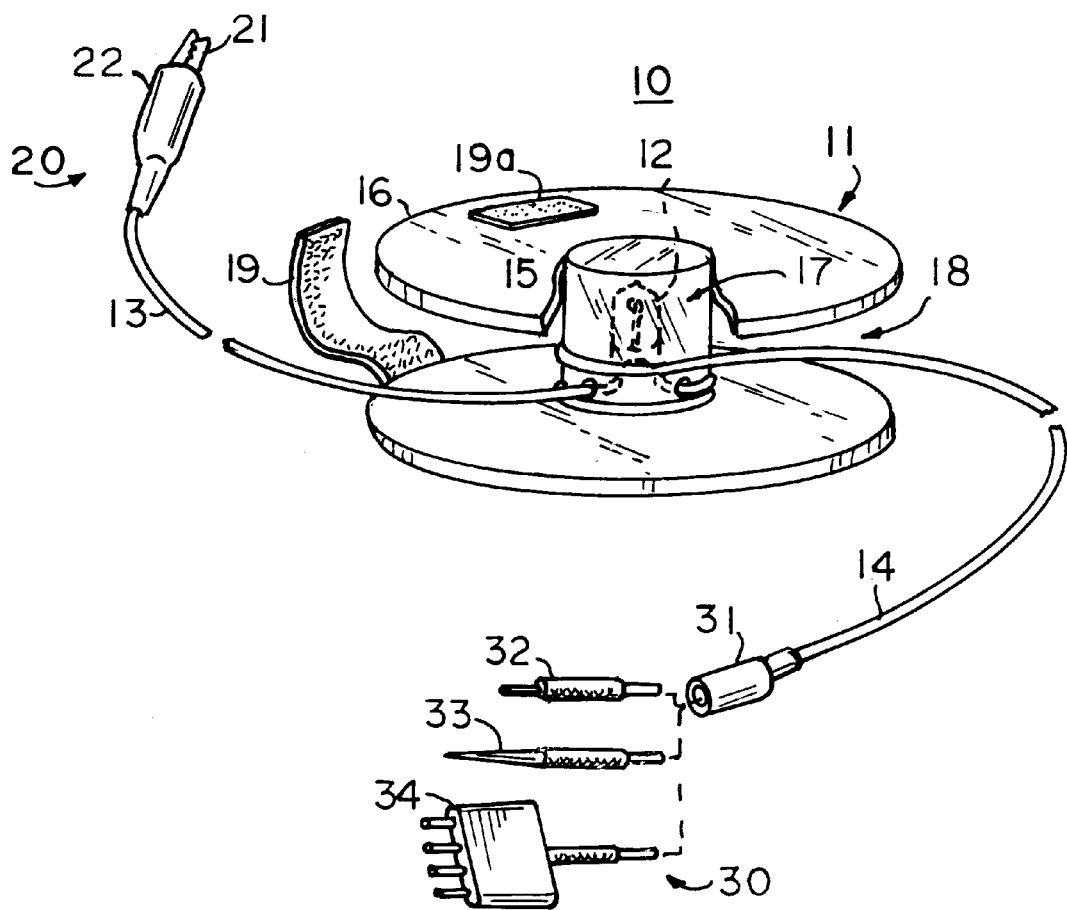
FIG. 1 is a perspective view of a test light with leads extended and showing alternate adapters.
Figure 2:
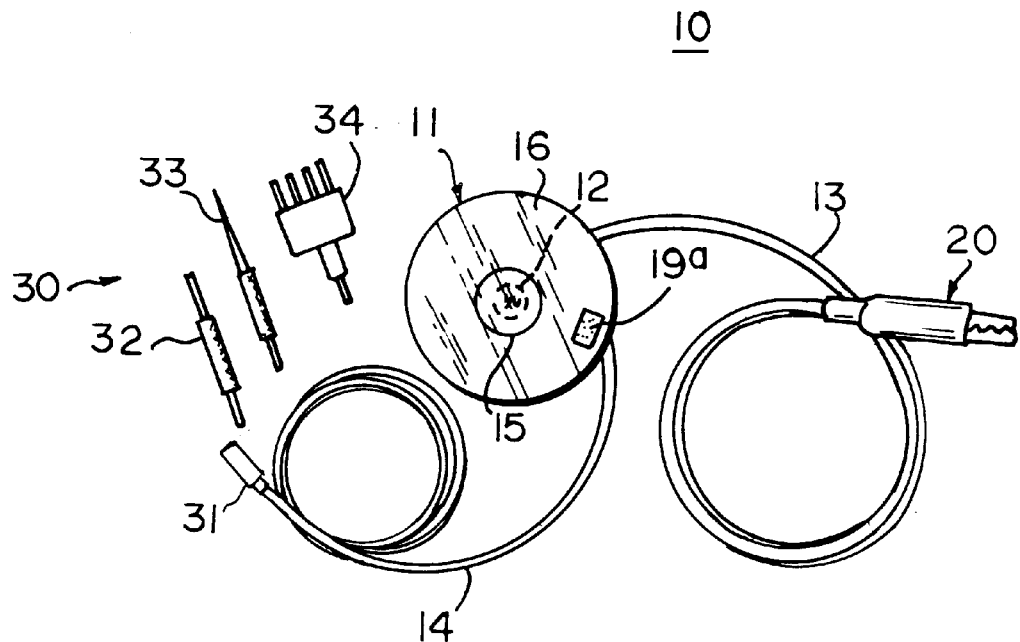
FIG. 2 is a reduced plan view of the test light of FIG. 1.
Figure 3:
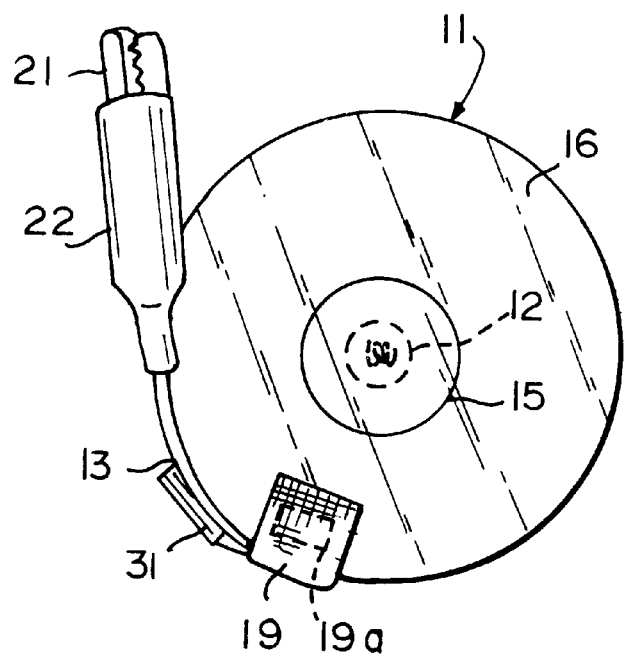
FIG. 3 is an enlarged plan view of the test light of FIG. 1 with the leads stored on the test light housing.

Referring to FIGS. 1–3, there is illustrated an embodiment of a test light, generally designated by the numeral 10. In the illustrated embodiment, the test light 10 includes a housing 11, a light source 12 disposed within the housing 11, and test leads 13 and 14 having proximal ends conductively coupled to terminals of the light source12. The light source 12 may be any of a number of different types of incandescent or fluorescent light bulbs or other suitable light-generating devices.

In this embodiment, the housing 11 is configured as a relatively flat and round spool or reel with a cylindrical hub 15 and coaxial circular end walls 16 which extend radially outwardly well beyond the hub 15 for cooperation therewith to define an annular channel 18 for receiving the leads 13 and 14. A cavity 17 for receiving the light source 12 is defined inside the hub 15. The housing 11 may be made of a light-transmitting material, such as suitable clear or translucent plastic material, in order to enable the entire housing 11 to be illuminated when the light source 12 is activated. A strap 19 may detachably extend transversely across the channel 18, anchored to an external surface of one of the end walls 16 the housing 11. For example, the strap 19 could be a hook-and-eyelet type fastening of the type sold under the trademark VELCRO, wherein the strap 19 is formed of a hook-type material having one end fixedly secured to one end wall 16 and the other end releasably attachable to an eyelet-type patch 19a fixedly secured to the other end wall 16, in a known manner.

The test lead 13 has a distal end connected to a connector assembly 20, which may be an alligator-type clip 21 provided with an electrically insulating shroud 22, in a known manner. The test lead 14 has a distal end connected to a connector assembly 30, which includes a base connector 31 fixed to the distal end of the test lead 14, and a plurality of adapter connectors 32, 33, and 34 selectively connectable to the base connector 31. In the illustrated embodiment, the base connector 31 is a female connector and each of the adapter connectors 32–34 has a male plug end adapted to be plugged into the base connector 31. The adapter connectors 32–34 respectively have different types of probe ends for respectively effecting probe-type connection to a variety of different types of test points or terminals in associated electric circuits to be tested. In the illustrated embodiment, the adapter connector 32 has a single plug-type probe, the adapter connector 33 has a pointed probe tip, and the adapter connector 34 has a multi-terminal probe, which could be male or female. While these types of adapter connectors are shown for purposes of illustration, it will be appreciated that a variety of other types could be provided to mate with or facilitate connection to a variety of other different types of test points or terminals. Also, while the base connector 31 is illustrated as being a female connector, it will be appreciated that it could be a male connector. The provision of a plurality of adapter connectors ensures that there will be proper, continuous contact between the test lead 14 and the terminal or test point of the circuit being tested, and prevents the user from damaging the terminal or test point during testing.

In use, it will be appreciated that the alligator clip 21 will be connected to a suitable reference or ground point, while the selected adapter connector of the connector assembly 30 will be connected to a selected test point or terminal in the circuit to be tested. If there is voltage or current in the terminal tested, the light source 12 will be energized causing the entire housing 11 to be illuminated. The visibility of the light source 12 is further ensured by the use of the elongated test leads 13 and 14, which allow the housing 11 to be placed in a location that is easily visible to the user and to be visible from multiple directions. With the ability of the entire housing 11 to be illuminated, and the ability to place the housing in a visible location, the test light 10 enjoys significantly greater visibility than its prior art counterparts. The flat circular end walls 16 of the housing 11 provide stable bases for the housing 11, so that it will tend to remain where it is placed for the duration of the test.

Referring to FIG. 2, in this embodiment, in order to store the test light 10, the leads 13 and 14 may be wound around the hub 15 of the housing 11 and received by the channel 18. Once the leads have been wound around the hub 15, the strap 19 is then anchored transversely across the channel 18 in order to retain the leads 13 and 14 in place.

While, in the illustrated embodiment, the test light 11 includes only two leads 13 and 14, it will be appreciated that it could be configured to contain a plurality of pairs of test leads and a similar plurality of light sources, with each pair of test leads conductively coupled to a different light source and, if desired, the light sources could be of different colors, to facilitate simultaneous testing of different circuit test points.

The matter set forth in the foregoing description and accompanying drawings is offered by way of illustration only and not as a limitation. While particular embodiment has been shown and described, it will be apparent to those skilled in the art that changes and modifications may be made without departing from the broader aspects of applicant's contribution. The actual scope of the protection sought is intended to be defined in the following claims when viewed in their proper perspective based on the prior art.

I claim:

1. A circuit test light comprising:
   a spool-shaped light transmitting housing including a cylindrical hub integral at its ends with enlarged flat end plates which extend radially outwardly from the hub for cooperation therewith to define an open channel,
   a light source disposed within the hub,
   two elongated flexible test leads extending from the hub and each having a proximal end permanently disposed within the hub and directly connected to the light source and a distal end disposed outside the hub, and
   connector assemblies respectively coupled to the distal ends of the test leads.

2. The test light of claim 1, wherein each of the housing end plates defines a flat, stable base on which the housing can be rested.

3. The test light of claim 1, and further comprising a closure for spanning the end plates to retain the connection means in the channel.

4. The test light of claim 1, wherein the housing is translucent.

5. The test light of claim 1, wherein at least one of the connector assemblies includes a base connector connected to the associated lead and a plurality of adapter connectors respectively connectable to the base connector for providing connection, respectively, to different types of terminals to be tested.

6. The test light of claim 5, wherein the base connector is a female connector.

7. The test light of claim 5, wherein at least one of the adapter connectors is a multi-terminal connector.

8. A method of detecting a voltage between two circuit points comprising:
   connecting first ends of two elongated flexible test leads respectively to the points,
   connecting second ends of the test leads to a light source for energizing the light source, and
   disposing the light source in a cylindrical hub of a light-transmitting spool-shaped housing having flat end plates which extend substantially beyond the light source for illuminating the housing so that it is viewable from multiple directions at locations remote from the circuit points.

9. The method of claim 8, and further comprising resting the housing on one of its flat end plates when in use.

10. The method of claim 8, and further comprising winding the test leads about the hub and between the end plates of the housing when not in use.

11. The method of claim 10, and further comprising retaining the test leads on the housing when not in use.

* * * * *